United States Patent [19]
Umeda et al.

[11] Patent Number: 5,529,938
[45] Date of Patent: Jun. 25, 1996

[54] METHOD FOR PRODUCING LIGHT-EMITTING DIODE

[75] Inventors: Hiroshi Umeda, Yamatotakada; Hiroshi Tanaka, Nara; Masamichi Harada, Nara-ken; Yasuhiko Arai, Nara, all of Japan

[73] Assignee: Sharp Kabushiki Kaisha, Osaka, Japan

[21] Appl. No.: 450,922

[22] Filed: May 26, 1995

[30] Foreign Application Priority Data

May 31, 1994 [JP] Japan .................................. 6-117999

[51] Int. Cl.$^6$ ............................................ H01L 21/265
[52] U.S. Cl. .................. 437/22; 437/23; 437/120; 437/130
[58] Field of Search .............................. 437/22, 23, 119, 437/120, 121, 125, 127, 130, 904, 905

[56] References Cited

U.S. PATENT DOCUMENTS

| | | | |
|---|---|---|---|
| 4,154,630 | 5/1979 | Diguet et al. ............................ | 437/120 |
| 5,063,166 | 11/1991 | Mooney et al. ........................... | 437/22 |
| 5,164,329 | 11/1992 | Moyer et al. .............................. | 437/23 |
| 5,284,781 | 2/1994 | Satyanarayan et al. ................... | 437/23 |
| 5,407,858 | 4/1995 | Yanagisawa et al. .................... | 437/130 |

FOREIGN PATENT DOCUMENTS 60-19676   5/1985   Japan .

Primary Examiner—Kevin M. Picardat
Attorney, Agent, or Firm—Nixon & Vanderhye

[57] ABSTRACT

A method for producing a light-emitting diode provided with a pn junction of GaP containing nitrogen on an n-type GaP substrate, includes the steps of: forming an n-type GaP layer on the n-type GaP substrate by epitaxial growth by bringing the n-type GaP substrate into contact with an oversaturated melted Ga; forming an n-type GaP:N layer having a low n-type carrier concentration on the n-type GaP layer by epitaxial growth by bringing the melted Ga into contact with $NH_3$ gas; and forming a p-type GaP:N layer having a carrier concentration almost equal to a carrier concentration of the n-type GaP:N layer on the n-type GaP:N layer.

4 Claims, 5 Drawing Sheets

METHOD FOR PRODUCING LIGHT-EMITTING DIODE

BACKGROUND OF THE INVENTION

1. Field of the Invention

The present invention relates to a method for producing a light-emitting diode (LED), and more particularly to a liquid phase epitaxial growth method used for producing a high-intensity GaP olive color LED (i.e., an LED having a high light-emitting efficiency) for use in outdoor display apparatus or the like.

2. Description of the Related Art

In general, LEDs used in display apparatus or the like consume less electric power with increased light-emitting efficiency. Therefore, higher light-emitting efficiency has been demanded particularly in LEDs for use outdoors.

GaP olive color LEDs have a low light-emitting efficiency because GaP crystal is an indirect transition type semiconductor. However, such diodes can emit light with a satisfactory efficiency by introducing nitrogen (N) into the GaP crystal. GaP containing N is used for a conventional high-intensity GaP olive color LED. In the following description, GaP containing N will be referred to as GaP:N.

In order to allow GaP:N LEDs to have a high light-emitting efficiency, it is important to improve the crystallinity of a pn junction.

The GaP:N LEDs can be generally produced by using a liquid phase epitaxial growth method. FIG. 5A is a diagram schematically showing epitaxial growth layers of GaP:N LED; FIG. 5B is a carrier concentration profile of each layer thereof.

As shown in FIGS. 5A and 5B, an n-type GaP layer 21 is formed on an n-type GaP substrate 20 with a heat-melted Ga containing a dopant and phosphorus (P) (hereafter, referred to as melted Ga) by liquid phase epitaxial growth. At this time, the surface of the n-type GaP substrate 20 is generally melt back with the unsaturated melted Ga to obtain crystal lattice matching. After the n-type GaP layer 21 is grown to a predetermined thickness (A of FIG. 5B), an n-type GaP:N layer 22 containing N is formed on the n-type GaP layer 21. In general, N is introduced into the n-type GaP:N layer 22 by bringing $NH_3$ gas into contact with the melted Ga.

After the n-type GaP:N layer 22 is grown to a predetermined thickness (B of FIG. 5B), a p-type GaP:N layer 23 (C of FIG. 5B) is formed thereon. Here, Zn is used as a p-type dopant. The Zn can be obtained by bringing vaporized Zn into contact with the melted Ga.

Assuming that the carrier concentration of the n-type GaP layer 21, the n-type GaP:N layer 22, and the p-type GaP:N layer 23 are respectively $n_1$, $n_2$, and $p$, the relationships: $n_1 > n_2$, $n_2 < p$ can be generally obtained. Alternatively, in the case where the p-type GaP:N layer 23 is divided into two layers and the respective carrier concentrations are assumed to be $p_1$ and $p_2$, the relationships: $n_1 < n_2$, $p_1 < p_2$, and $n_2 > p$ can be obtained (Japanese Patent Publication No. 60-19676).

In the case where the carrier concentration satisfies the relationship: $n_2 < p$, there arises a problem in that an implantation efficiency is low although the crystallinity of a pn junction is relatively good. In the case where the carrier concentration satisfies the relationship: $n_2 > p$, there arises a problem in that a crystal defect is likely to be introduced into the crystal at the pn junction by donors although the implantation efficiency is better than the implantation efficiency in the case of $n_2 < p$.

Furthermore, in the case where the n-type GaP layer 21 is grown by melting back the surface of the n-type GaP substrate 20 with the melted Ga, an n-type dopant and other impurities are mixed in the melted Ga. As a result, the carrier concentration at the pn junction obtained by forming the p-type GaP:N layer 23 on the n-type GaP:N layer 22 cannot be sufficiently controlled, which allows a non-light-emitting level to be readily formed.

Furthermore, while the surface of the n-type GaP substrate 20 is melt back. The distribution of the partial pressure of P becomes non-uniform at the interface since the partial pressure of P is small at the interface between the n-type GaP substrate 20 and the melted Ga. As a result, the composition of crystal becomes non-uniform, and the quality of the crystal of the epitaxial growth layer is likely to decrease.

SUMMARY OF THE INVENTION

The method for producing a light-emitting diode provided with a pn junction of GaP containing nitrogen on an n-type GaP substrate of this invention, which overcomes the above-described and numerous other disadvantages and deficiencies of the prior art, includes the steps of: forming an n-type GaP layer on the n-type GaP substrate by epitaxial growth by bringing the n-type GaP substrate into contact with an oversaturated melted Ga; forming an n-type GaP:N layer having a low n-type carrier concentration on the n-type GaP layer by epitaxial growth by bringing the melted Ga into contact with $NH_3$ gas; and forming a p-type GaP:N layer having a carrier concentration almost equal to a carrier concentration of the n-type GaP:N layer on the n-type GaP:N layer.

In a preferred embodiment, the p-type GaP:N layer is rendered a p-type by a p-type dopant derived from carbon forming a liquid phase epitaxial growth boat material.

In a preferred embodiment, Si is used as an n-type dopant.

Thus, the invention described herein makes possible the advantages of (1) providing a method for producing an LED where an n-type GaP layer has good crystallinity, which is prevented from being caused crystal defects or the like by donors, can be formed; (2) providing a method for producing an LED where stable carrier concentration can be obtained and non-light-emitting level can be decreased; (3) providing a method for producing an LED where a pn junction with good crystallinity and good implantation efficiency can be formed; and (4) providing a method for producing an LED where light-emitting efficiency can be improved, compared with the conventional LED.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of an illustrative example with reference to FIGS. 1 to 4. It is noted that the present invention is not limited to the following example.

Figure 1:
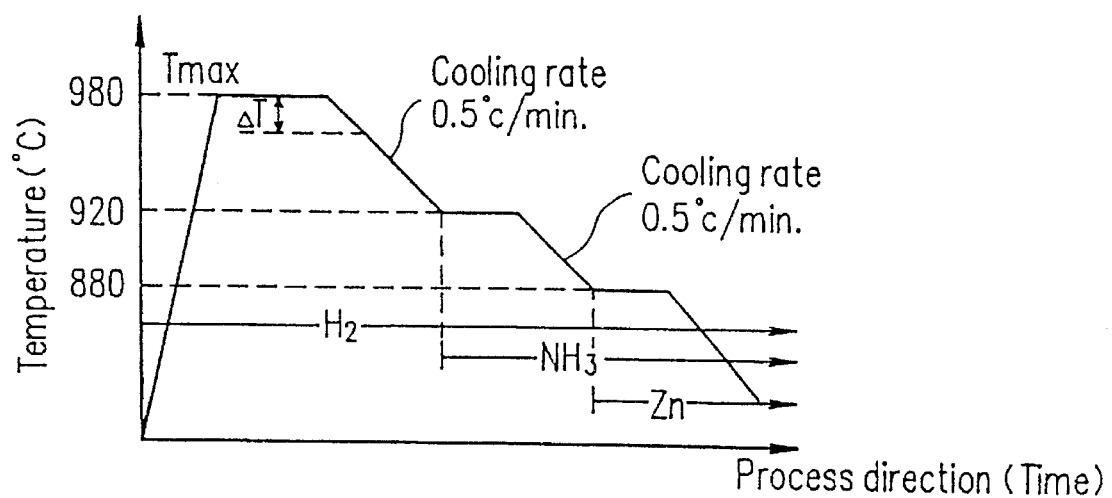
FIG. 1 is a diagram showing a temperature program of liquid phase epitaxial growth of a GaP LED in accordance with one example of the method of the present invention.
Figure 2A:
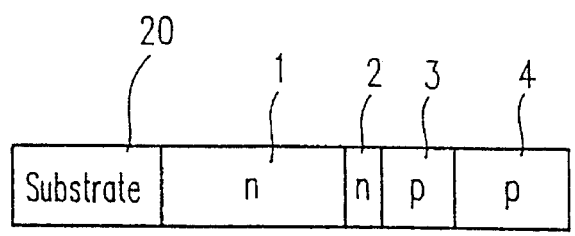
FIG. 2A is a diagram schematically showing epitaxial growth layers of a GaP LED obtained using one example of the method of the present invention.
Figure 2B:
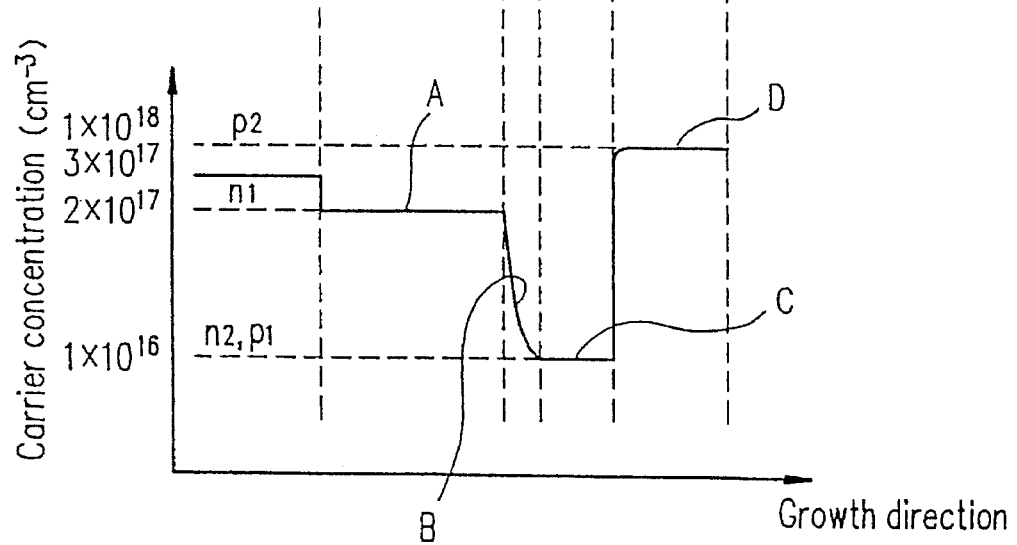
FIG. 2B is a carrier concentration profile of each layer thereof.
Figure 3:
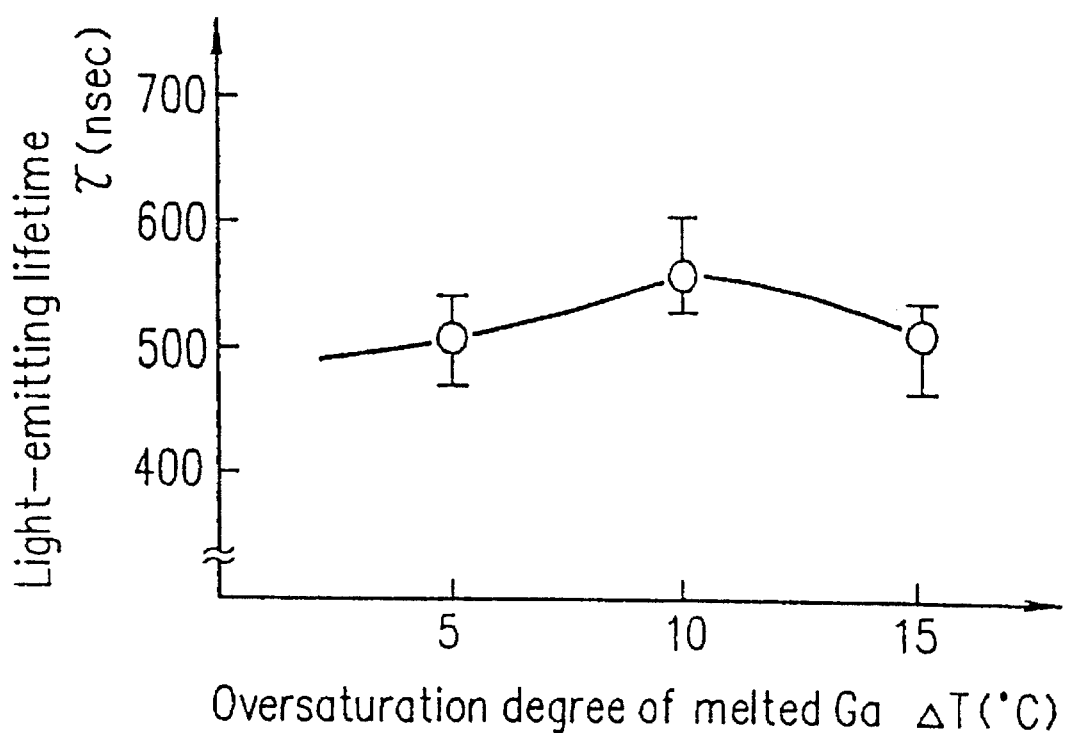
FIG. 3 is a graph showing the relationship between the oversaturation degree of a melted Ga used for liquid epitaxial growth and the light-emitting lifetime.
Figure 4:
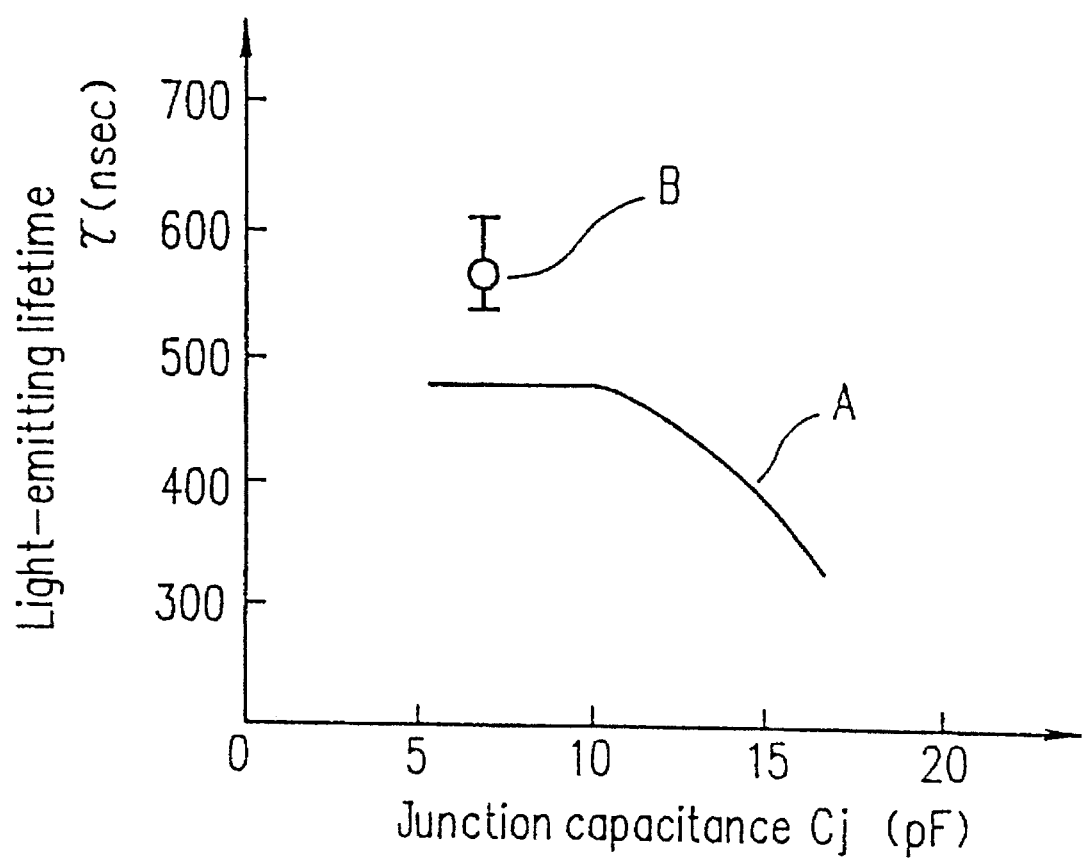
FIG. 4 is a graph showing the comparison in characteristics between an LED obtained using an example of the method of the present invention and an LED obtained using the conventional method.
Figures 5A, 5B:
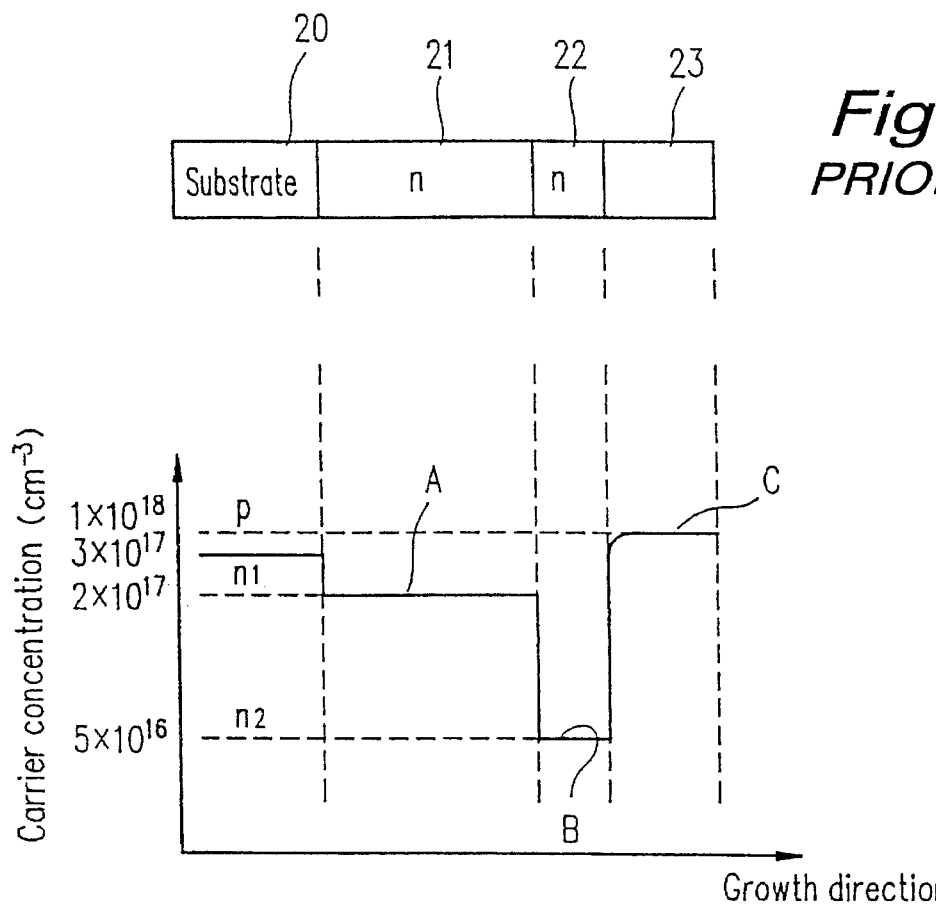
FIG. 5A is a diagram schematically showing epitaxial growth layers of a GaP:N light-emitting diode.
FIG. 5B is a carrier concentration profile of each layer thereof.

Referring to FIG. 1, a temperature program for liquid phase epitaxial growth of a GaP LED using the present example of the method of the present invention is shown. FIG. 2A is a diagram schematically showing epitaxial growth layers of a GaP LED obtained in accordance with the present example of the method of the present invention, and FIG. 2B is a carrier concentration profile of each layer thereof. FIG. 3 is a graph showing the relationship between the oversaturation degree of a melted Ga used for liquid epitaxial growth and the light-emitting lifetime. FIG. 4 is a graph showing the comparison in characteristics between the LED obtained using the method of the present invention and the LED of the conventional method.

An n-type GaP substrate 20 used in the present example can be prepared by various known methods. The n-type carrier concentration of the n-type GaP substrate 20 is preferably in the range of $3\times10^{17}$ cm$^{-3}$ to $4\times10^{17}$ cm$^{-3}$.

Before liquid phase epitaxial growth is effected on the n-type GaP substrate 20, a melted Ga with an n-type dopant added is saturated at a highest holding temperature $T_{max}$ of 980° C. A n-type dopant, S, Te, Si, or the like can be used. Preferably, Si is used. A liquid phase epitaxial growth boat material is made of carbon (C).

After the melted Ga is saturated, it is gradually cooled from 980° C. to, for example, 970° C. (hereinafter, referred to as a cooling temperature) at 0.5° C./min, whereby the melted Ga is oversaturated. It is assumed that the difference between a saturation temperature and a cooling temperature is an oversaturation degree $\Delta T$ of the melted Ga. By oversaturating the melted Ga, the n-type GaP substrate 20 is not required to be melt back during a liquid epitaxial growth step. In this manner, the melted Ga can be prevented from being mixed with impurities of the n-type GaP substrate 20. As a result, the non-light-emitting level of the resultant GaP LED decreases. Furthermore, since the background concentration of the melted Ga does not vary, carriers at a pn junction obtained during the later step can be stably made low in concentration. Furthermore, since an initial growth speed of the crystal is high and a P partial pressure at the interface between the n-type GaP substrate 20 and the melted Ga is sufficient, a crystal defect or the like caused by donors can be prevented. Consequently, an n-type GaP layer having good crystallinity will be formed on the n-type GaP substrate 20.

The melted Ga is cooled down to 920° C. (hereinafter, referred to as a cooling temperature 1) at 0.5° C./min. During this cooling step, the melted Ga having an oversaturation degree $\Delta T$ of 10° C. is in contact with the n-type GaP substrate 20. An n-type GaP layer 1 is formed on the n-type GaP substrate 20 by epitaxial growth (A of FIG. 2B). The oversaturation degree $\Delta T$ of 10° C. used is set so as to optimize the light-emitting lifetime of the LED eventually obtained using the melted Ga of the present invention. FIG. 3 is a graph showing the relationship between the oversaturation degree of the melted Ga used for liquid epitaxial growth and the light-emitting lifetime. As shown in FIG. 3, the light-emitting lifetime is varied depending upon the oversaturation degree of the melted Ga. This is considered as follows: As the oversaturation degree $\Delta T$ gets higher, an initial epitaxial growth speed becomes faster; therefore, the crystallinity of GaP is improved. However, when the oversaturation degree becomes too high, the microcrystal starts segregating in the melted Ga, which degrades the crystallinity of GaP. Thus, the oversaturation degree $\Delta T$ is preferably about 15° C., and more preferably in the range of about 5° C. to about 10° C.

The thickness of the n-type GaP layer 1 obtained during the above step is in the range of approximately 40 μm to approximately 60 μm. The carrier concentration thereof is in the range of about $1\times10^{17}$ cm$^{-3}$ to about $3\times17^{17}$ cm$^{-3}$.

An n-type GaP:N layer 2 is formed on the n-type GaP layer 1 by liquid phase epitaxial growth by bringing the melted Ga into contact with NH$_3$ gas and keeping this condition at 920° for approximately 40 minutes, for example. By maintaining this temperature, the n-type GaP:N layer 2 is grown by an oversaturated amount of the melted Ga. GaN, Si$_3$N$_4$, and the like are gradually formed in the melted Ga in proportion to a contact time between NH$_3$ gas and the melted Ga. The dopant Si gradually moves out of a system of a liquid phase growth layer with the increase in GaN, Si$_3$N$_4$, and the like; therefore, the Si concentration gradually decreases along the growth direction of the n-type GaP:N layer 2. That is, during this step, the n-type GaP:N layer 2 with increased N concentration $n_T$ and decreased n-type carrier concentration $n_D$ (B of FIG. 2B) can be obtained. The thickness of the n-type GaP:N layer 2 is, for example, in the range of about 2 μm to about 4 μm.

The time required for growing the n-type GaP:N layer 2 is generally in the range of about 20 to about 60 minutes. Preferably, the time required for growing is about 40 minutes. The final n-type carrier concentration at an epitaxial growth terminal of the n-type GaP:N layer 2 is preferably in the range of approximately $5\times10^{15}$ cm$^{-3}$ to approximately $50\times10^{15}$ cm$^{-3}$.

Next, the melted Ga is gradually cooled to 880° C. at a cooling speed of 0.5° C./min in the presence of NH$_3$ gas, whereby a GaP:N layer 3 is formed on the n-type GaP:N layer 2 by liquid phase epitaxial growth. At this time, because of the decrease in Si concentration in the melted Ga, C concentration supplied from the epitaxial growth boat material, which is made of C, becomes higher than the Si concentration. Thus, the p-type GaP:N layer 3, which is a so-called a background concentration layer, is formed on the n-type GaP:N layer 2 (C of FIG. 2B). The resultant p-type GaP:N layer 3 has a thickness of about 20 μm and a carrier concentration of about $10^{16}$ cm$^{-3}$ or less. During this step, the carrier concentration of the p-type GaP:N layer 3 can be regulated so as to be almost equal to that of the n-type GaP:N layer 2.

Furthermore, a p-type GaP:N layer 4 having a high p-type carrier concentration can be formed on the p-type GaP:N layer 3, if required, under the condition that a p-type dopant such as Zn is supplied. Zn is introduced into the melted Ga by bringing the Zn vapor which is a p-type dopant into contact with the melted Ga, for example, at 880° C. By using the melted Ga into which Zn has been introduced, the p-type GaP:N layer 4 having a p-type carrier concentration sufficient for forming an ohmic contact is formed on the p-type GaP:N layer 3 by liquid phase epitaxial growth, whereby the production of an LED is completed (D of FIG. 2B).

Consequently, a GaP LED can be obtained, which includes the n-type GaP layer 1, the n-type GaP:N layer 2, the first p-type GaP:N layer 3, and the second p-type GaP:N layer 4, where the respective carrier concentrations $n_1$, $n_2$, $p_1$, and $p_2$ satisfy the following relationships: $n_1 > n_2$, $p_1 < p_2$, and $n_2 \approx p_1$. By making $n_2$ nearly equal to $p_1$, a defect caused by donors can be prevented, and hence a pn junction having good crystallinity can be obtained. Furthermore, a pn junction having good implantation efficiency can be obtained.

FIG. 4 is a graph showing the comparison in light-emitting lifetime (20 mA) between the LED obtained using the exemplary method of the present invention produced at an oversaturation degree ΔT of 10° C. and the LED produced using the conventional method. In this figure, the horizontal axis represents a junction capacitance $C_j$ and the vertical axis represents light-emitting lifetime τ. Here, the N concentration $n_T$ is about $10^{18}$ cm$^{-3}$. The light-emitting lifetime τ of the LED produced using the exemplary method is 570 nsec, while the light-emitting lifetime τ of the LED produced by the conventional method is 300 to 480 nsec (A of FIG. 4). The LED produced by the exemplary method had its light-emitting lifetime increased by about 1.2 times that of the conventional one (B of FIG. 4).

An LED chip was assayed on $T_0$-18 gold stem and a light intensity was measured. This revealed that the LED produced by the exemplary method had its average light-emitting efficiency increased by 1.2 to 1.3 times that of the conventional one.

As described above, according to the present invention, the n-type GaP layer is formed on the n-type GaP substrate by epitaxial growth by bringing the oversaturated melted Ga into contact with the n-type GaP substrate. The n-type GaP:N layer with decreased n-type carrier concentration is formed on the n-type GaP layer by epitaxial growth by bringing the melted Ga into contact with NH$_3$ gas. Then, the p-type GaP:N layer having a carrier concentration almost equal to that of a low carrier concentration area of the n-type GaP:N layer is formed on the n-type GaP:N layer by epitaxial growth. The GaP:N LED thus obtained has the following characteristics:

(1) An n-type GaP layer having good crystallinity which prevents donors from causing crystal defects or the like can be formed; (2) Stable carrier concentration can be obtained and non-light-emitting level can be decreased; (3) A pn junction with good crystallinity and good implantation efficiency can be formed; and (4) Light-emitting efficiency can be improved as compared with a conventional LED.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a light-emitting diode having a pn junction of GaP containing nitrogen on an n-type GaP substrate, comprising the steps of:

forming an n-type GaP layer on the n-type GaP substrate by epitaxial growth by bringing the n-type GaP substrate into contact with an oversaturated melted Ga;

forming an n-type GaP:N layer having a low n-type carrier concentration on the n-type GaP layer by epitaxial growth by bringing the melted Ga into contact with NH$_3$ gas; and forming a p-type GaP:N layer having a carrier concentration almost equal to a carrier concentration of the n-type GaP:N layer on the n-type GaP:N layer.

2. A method for producing a light-emitting diode according to claim 1, wherein the p-type GaP:N layer is rendered a p-type by a p-type dopant derived from carbon forming a liquid phase epitaxial growth boat material.

3. A method for producing a light-emitting diode according to claim 1, wherein Si is used as an n-type dopant.

4. A method for producing a light-emitting diode according to claim 2, wherein Si is used as an n-type dopant.

\* \* \* \* \*